US012562728B2

(12) United States Patent
Chen et al.

(10) Patent No.: US 12,562,728 B2
(45) Date of Patent: Feb. 24, 2026

(54) SOLID-STATE SWITCH DEVICE AND OPERATING METHOD FOR THE SAME

(71) Applicant: Schneider Electric Industries SAS, Rueil-Malmaison (FR)

(72) Inventors: Xiaohang Chen, Shanghai (CN); Wanlong Bai, Shanghai (CN); Zuoren Wu, Shanghai (CN); Yangfeng Song, Shanghai (CN); Qing Ling, Shanghai (CN); Jiamin Chen, Shanghai (CN)

(73) Assignee: Schneider Electric Industries SAS, Rueil-Malmaison (FR)

( * ) Notice: Subject to any disclaimer, the term of this patent is extended or adjusted under 35 U.S.C. 154(b) by 211 days.

(21) Appl. No.: 18/565,076

(22) PCT Filed: Jun. 28, 2023

(86) PCT No.: PCT/CN2023/103238
§ 371 (c)(1),
(2) Date: Nov. 28, 2023

(87) PCT Pub. No.: WO2024/002169
PCT Pub. Date: Jan. 4, 2024

(65) Prior Publication Data
US 2025/0096789 A1    Mar. 20, 2025

(30) Foreign Application Priority Data
Jun. 30, 2022    (CN) .......................... 202210766764.6

(51) Int. Cl.
*H03K 17/0812*    (2006.01)
*H03K 17/687*    (2006.01)

(52) U.S. Cl.
CPC ..... *H03K 17/08122* (2013.01); *H03K 17/687* (2013.01); *H03K 2217/0054* (2013.01)

(58) Field of Classification Search
CPC ........... H03K 17/08122; H03K 17/687; H03K 2217/0054
See application file for complete search history.

(56) References Cited

U.S. PATENT DOCUMENTS

| | | | |
|---|---|---|---|
| 4,680,490 A | 7/1987 | Baker et al. | |
| 11,349,297 B2 * | 5/2022 | Telefus | ............... H02H 1/0015 |

(Continued)

FOREIGN PATENT DOCUMENTS

| | | |
|---|---|---|
| GB | 2461994 A | 1/2010 |

OTHER PUBLICATIONS

Extended European Search Report dated Mar. 12, 2025 for corresponding European Patent Application No. 23809071.6, 9 pages.

*Primary Examiner* — Scott Bauer
(74) *Attorney, Agent, or Firm* — Patterson + Sheridan, LLP

(57) ABSTRACT

There is provided a solid-state switch device connected between a single-phase power supply source and a load, including: a phase bridge arm circuit, including a first and a second power semiconductor switches, which each includes a first, a second and a control ends and each includes a body diode, wherein the second ends of the first and the second power semiconductor switches are connected in series in phase of a single-phase power supply source; a phase voltage sampling circuit, configured to acquire sampled values of phase voltage of the phase bridge arm circuit; and a control circuit, configured to determine direction of the phase voltage according to the sampled values, turn on one of the power semiconductor switches whose body diode direction is the same as the direction of the phase voltage, and turn on the other within a half cycle after the immediate zero-crossing of the phase voltage.

15 Claims, 5 Drawing Sheets

100

(56) References Cited

U.S. PATENT DOCUMENTS

| | | | |
|---|---|---|---|
| 11,522,465 B1 * | 12/2022 | Schaffarra | H02M 5/2935 |
| 2004/0222701 A1 | 11/2004 | Kugelman | |
| 2005/0012689 A1 * | 1/2005 | Abdoulin | G09G 3/2965 |
| | | | 345/60 |
| 2018/0123584 A1 * | 5/2018 | Morimoto | B60L 3/0084 |
| 2020/0366079 A1 * | 11/2020 | Telefus | H02J 13/00022 |

* cited by examiner

100

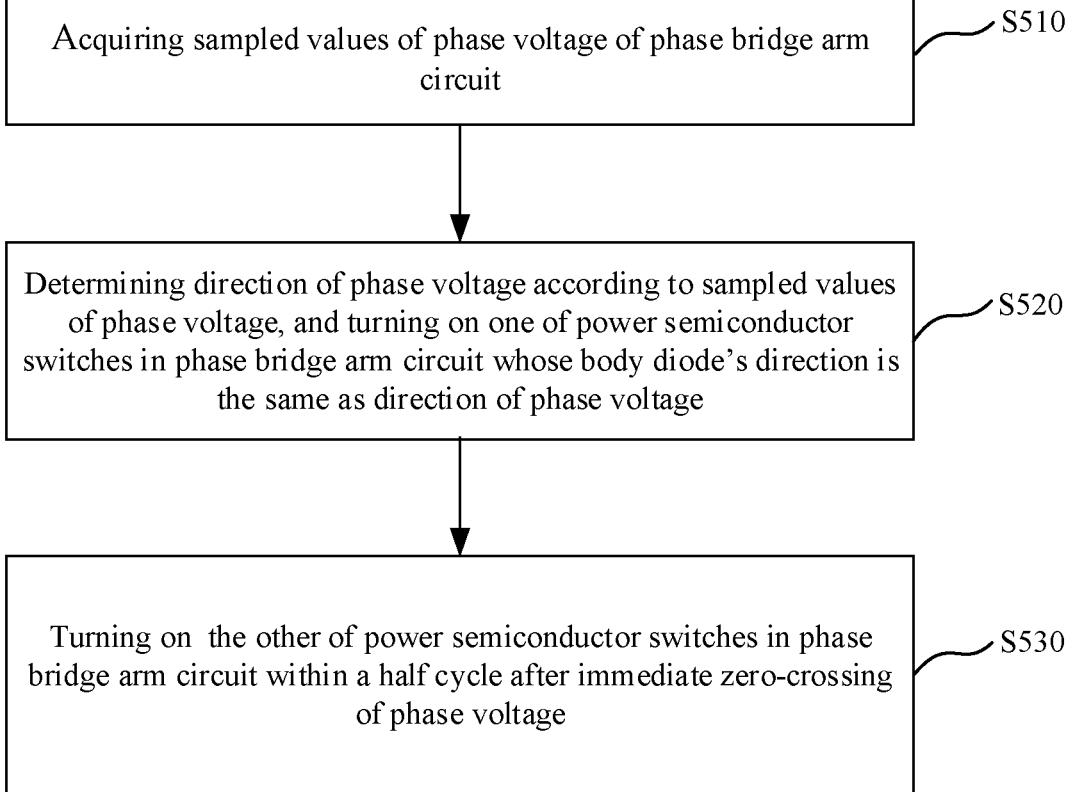

Acquiring sampled values of phase voltage of phase bridge arm circuit — S510

Determining direction of phase voltage according to sampled values of phase voltage, and turning on one of power semiconductor switches in phase bridge arm circuit whose body diode's direction is the same as direction of phase voltage — S520

Turning on the other of power semiconductor switches in phase bridge arm circuit within a half cycle after immediate zero-crossing of phase voltage — S530

Fig. 5

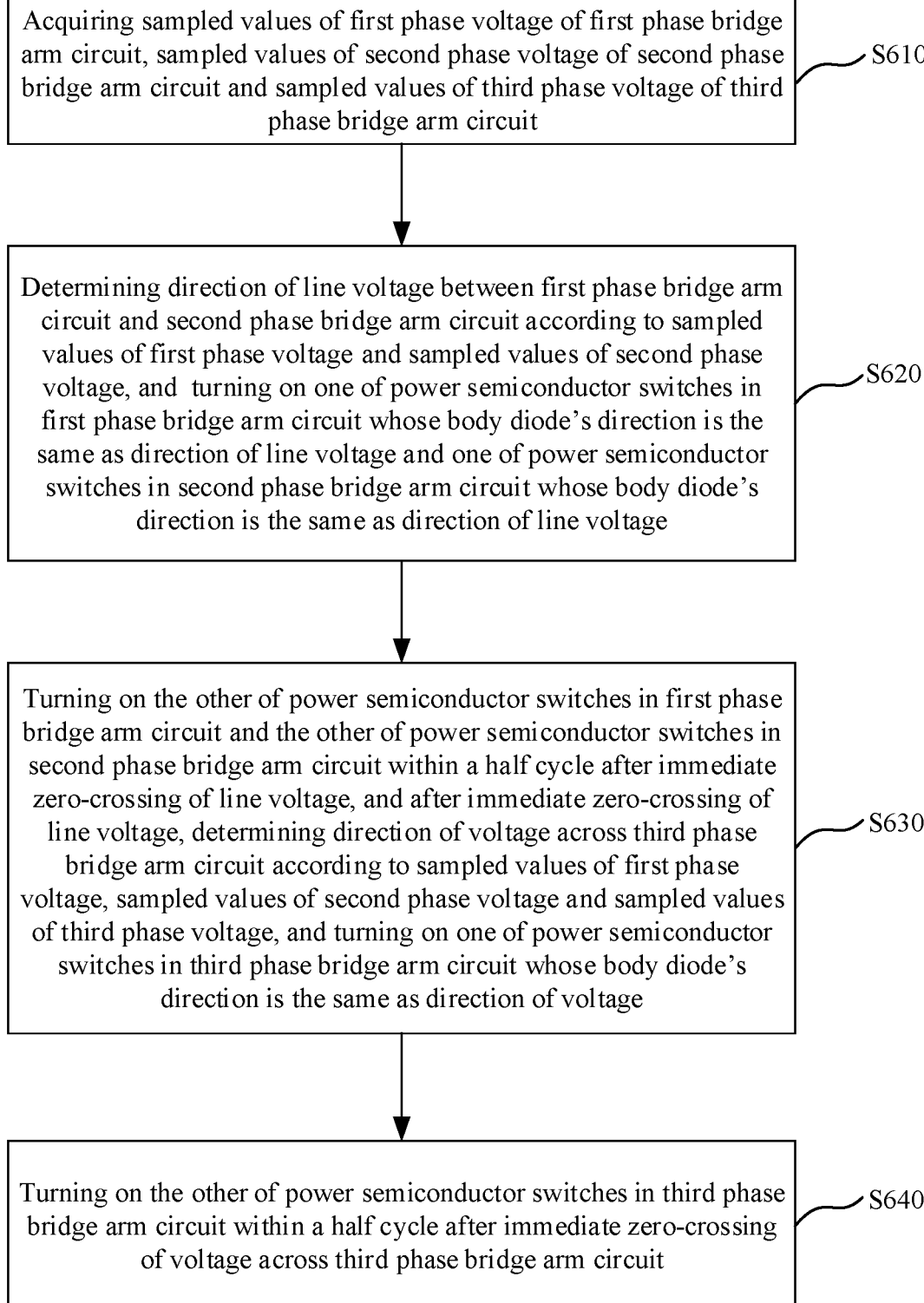

Acquiring sampled values of first phase voltage of first phase bridge arm circuit, sampled values of second phase voltage of second phase bridge arm circuit and sampled values of third phase voltage of third phase bridge arm circuit — S610

Determining direction of line voltage between first phase bridge arm circuit and second phase bridge arm circuit according to sampled values of first phase voltage and sampled values of second phase voltage, and turning on one of power semiconductor switches in first phase bridge arm circuit whose body diode's direction is the same as direction of line voltage and one of power semiconductor switches in second phase bridge arm circuit whose body diode's direction is the same as direction of line voltage — S620

Turning on the other of power semiconductor switches in first phase bridge arm circuit and the other of power semiconductor switches in second phase bridge arm circuit within a half cycle after immediate zero-crossing of line voltage, and after immediate zero-crossing of line voltage, determining direction of voltage across third phase bridge arm circuit according to sampled values of first phase voltage, sampled values of second phase voltage and sampled values of third phase voltage, and turning on one of power semiconductor switches in third phase bridge arm circuit whose body diode's direction is the same as direction of voltage — S630

Turning on the other of power semiconductor switches in third phase bridge arm circuit within a half cycle after immediate zero-crossing of voltage across third phase bridge arm circuit — S640

Fig. 6

SOLID-STATE SWITCH DEVICE AND OPERATING METHOD FOR THE SAME

CROSS-REFERENCE TO RELATED APPLICATION

The present application is a U.S. National Phase of International Application No. PCT/CN2023/103238 filed on Jun. 28, 2023, which claims the benefit of priority of China Patent Application No. 202210766764.6 filed on Jun. 30, 2022, and the disclosures of the above-mentioned International Application and China Patent Application are hereby incorporated by their entirety as a part of the present application.

TECHNICAL FIELD

The present disclosure relates to a solid-state switch device and an operating method for the solid-state switch device.

BACKGROUND

When an AC power grid supplies power to a load via a solid-state switch, if the solid-state switch is at a high voltage value upon its startup, it is possible to generate a large impact current, especially in the case of capacitive load. For a contactor based on a solid-state switch, because of its poor short-circuit endurance, they are generally configured with a fast response with respect to short-circuit current, which is usually less than 5 microseconds. Such a fast short-circuit protection response easily makes the impact current generated upon the startup of the solid-state switch to cause wrong startup of short-circuit protection. Therefore, it is particularly important to suppress the impact current upon the startup of the solid-state switch.

SUMMARY

In view of the above, the present disclosure provides a solid-state switch device, which can realize voltage zero-crossing startup, so that the current flowing through the load gradually rises from zero without generating a large impact current.

An aspect of the present disclosure provides a solid-state switch device connected between a single-phase power supply source and a load. The solid-state switch device comprises a phase bridge arm circuit, a phase voltage sampling circuit and a control circuit. The phase bridge arm circuit includes a first power semiconductor switch and a second power semiconductor switch, which each includes a first end, a second end and a control end and each includes a body diode, wherein the second ends of the first power semiconductor switch and the second power semiconductor switch are connected in series in phase of a single-phase power supply source. The phase voltage sampling circuit acquires sampled values of phase voltage of the phase bridge arm circuit. The control circuit determines direction of the phase voltage according to the sampled values of the phase voltage, turns on one of the power semiconductor switches in the phase bridge arm circuit whose body diode' direction is the same as the direction of the phase voltage, and turns on the other of the power semiconductor switches in the phase bridge arm circuit within a half cycle after the immediate zero-crossing of the phase voltage.

Optionally, the control circuit determines the direction of the phase voltage as a positive direction by determining that an average value of the latest predetermined number of sampled values of the phase voltage is greater than a predetermined positive threshold, or determines the direction of the phase voltage as a negative direction by determining that an average value of the latest predetermined number of sampled values of the phase voltage is less than a predetermined negative threshold.

Optionally, after determining the direction of the phase voltage as the positive direction, the control circuit determines that the phase voltage crosses zero by determining that the average value of the latest predetermined number of sampled values of the phase voltage is less than the predetermined positive threshold; or after determining the direction of the phase voltage as the negative direction, the control circuit determines that the phase voltage crosses zero by determining that the average value of the latest predetermined number of sampled values of the phase voltage is greater than the predetermined negative threshold.

Another aspect of the present disclosure provides a solid-state switch device connected between a three-phase power supply source and a load. The solid-state switch device comprises a first phase bridge arm circuit, a second phase bridge arm circuit, a third phase bridge arm circuit, a phase voltage sampling circuit and a control circuit. The first phase bridge arm circuit includes a first power semiconductor switch and a second power semiconductor switch, which each includes a first end, a second end and a control end and each includes a body diode, wherein the second ends of the first power semiconductor switch and the second power semiconductor switch are connected in series in a first phase of the three-phase power supply source. The second phase bridge arm circuit includes a third power semiconductor switch and a fourth power semiconductor switch, which each includes a first end, a second end and a control end and each includes a body diode, wherein the second ends of the third power semiconductor switch and the fourth power semiconductor switch are connected in series in a second phase of the three-phase power supply source. The third phase bridge arm circuit includes a fifth power semiconductor switch and a sixth power semiconductor switch, which each includes a first end, a second end and a control end and each includes a body diode, wherein the second ends of the fifth power semiconductor switch and the sixth power semiconductor switch are connected in series in a third phase of the three-phase power supply source. The phase voltage sampling circuit acquires sampled values of first phase voltage of the first phase bridge arm circuit, sampled values of second phase voltage of the second phase bridge arm circuit and sampled values of third phase voltage of the third phase bridge arm circuit. The control circuit performs the following operations: determining direction of a line voltage between the first phase bridge arm circuit and the second phase bridge arm circuit according to the sampled values of the first phase voltage and the sampled values of the second phase voltage, and turning on one of the power semiconductor switches in the first phase bridge arm circuit whose body diode's direction is the same as the direction of the line voltage and one of the power semiconductor switches in the second phase bridge arm circuit whose body diode's direction is the same as the direction of the line voltage; turning on the other of the power semiconductor switches in the first phase bridge arm circuit and the other of the power semiconductor switches in the second phase bridge arm circuit within a half cycle after the immediate zero-crossing of the line voltage, and determining, after the immediate zero-crossing of the line voltage, direction of a voltage across the third phase bridge arm circuit according to the sampled values of the first phase voltage, the sampled values of the second phase voltage and the sampled values of the third phase voltage, and turning on one of the power semiconductor switches in the third phase bridge arm circuit whose body diode's direction is the same as the direction of the voltage; and turning on the other of the power semiconductor switches in the third phase bridge arm circuit within a half cycle after the immediate zero-crossing of the voltage across the third phase bridge arm circuit. Wherein the first phase bridge arm circuit, the second phase bridge arm circuit and the third phase bridge arm circuit are connected in a star connection.

Optionally, each of the first to sixth power semiconductor switches is a metal oxide semiconductor field effect transistor, and the first end, the second end and the control end are a drain, a source and a gate, respectively; or each of the first to sixth power semiconductor switches is an insulated gate bipolar transistor, and the first end, the second end and the control end are a collector, an emitter and a base, respectively.

Optionally, the control circuit derives the latest predetermined number of sampled values of the line voltage from the latest predetermined number of sampled values of the first phase voltage and the latest predetermined number of sampled values of the second phase voltage, and determines the direction of the line voltage as a positive direction by determining that an average value of the latest predetermined number of sampled values of the line voltage is greater than a predetermined positive threshold, or determines the direction of the line voltage as a negative direction by determining that an average value of the latest predetermined number of sampled values of the line voltage is less than a predetermined negative threshold.

Optionally, the control circuit derives the latest predetermined number of sampled values of the voltage across the third phase bridge arm circuit from the latest predetermined number of sampled values of the first phase voltage, the latest predetermined number of sampled values of the second phase voltage and the latest predetermined number of sampled values of the third voltage, and determines that the direction of the voltage across the third phase bridge arm circuit is a positive direction by determining that an average value of the latest predetermined number of sampled values of the voltage across the third phase bridge arm circuit is greater than a predetermined positive threshold, or determines that the direction of the voltage across the third phase bridge arm circuit as a negative direction by determining that an average value of the latest predetermined number of sampled values of the voltage across the third phase bridge arm circuit is less than a predetermined negative threshold.

Optionally, after determining the direction of the line voltage as the positive direction, the control circuit determines that the line voltage crosses zero by determining that the average value of the latest predetermined number of sampled values of the line voltage is less than the predetermined positive threshold; or after determining the direction of the line voltage as the negative direction, the control circuit determines that the line voltage crosses zero by determining that the average value of the latest predetermined number of sampled values of the line voltage is greater than the predetermined negative threshold.

Optionally, after determining the direction of the voltage across the third phase bridge arm circuit as the positive direction, the control circuit determines that the voltage across the third phase bridge arm circuit crosses zero by determining that the average value of the latest predetermined number of sampled values of the voltage across the third phase bridge arm circuit is less than the predetermined positive threshold; or after determining the direction of the voltage across the third phase bridge arm circuit as the negative direction, the control circuit determines that the voltage across the third phase bridge arm circuit crosses zero by determining that the average value of the latest predetermined number of sampled values of the voltage across the third phase bridge arm circuit is greater than the predetermined negative threshold.

Another aspect of the present disclosure provides an operating method for a solid-state switch device connected between a single-phase power supply source and a load. The solid-state switch device includes a phase bridge arm circuit including a first power semiconductor switch and a second power semiconductor switch, which each includes a first end, a second end and a control end and each includes a body diode, wherein the second ends of the first power semiconductor switch and the second power semiconductor switch are connected in series in phase of a single-phase power supply source. The operating method comprise: acquiring sampled values of phase voltage of the phase bridge arm circuit; determining direction of the phase voltage according to the sampled values of the phase voltage, and turning on one of the power semiconductor switches in the phase bridge arm circuit whose body diode's direction is the same as the direction of the phase voltage; turning on the other of the power semiconductor switches in the phase bridge arm circuit within a half cycle after the immediate zero-crossing of the phase voltage.

Another aspect of the present disclosure is an operating method for a solid-state switch device connected between a three-phase power supply source and a load. The solid-state switch device includes a first phase bridge arm circuit, a second phase bridge arm circuit and a third phase bridge arm circuit which are connected in a star connection. The first phase bridge arm circuit includes a first power semiconductor switch and a second power semiconductor switch, which each includes a first end, a second end and a control end and each includes a body diode, wherein the second ends of the first power semiconductor switch and the second power semiconductor switch are connected in series in a first phase of the three-phase power supply source. The second phase bridge arm circuit includes a third power semiconductor switch and a fourth power semiconductor switch, which each includes a first end, a second end and a control end and each includes a body diode, wherein the second ends of the third power semiconductor switch and the fourth power semiconductor switch are connected in series in a second phase of the three-phase power supply source. The third phase bridge arm circuit includes a fifth power semiconductor switch and a sixth power semiconductor switch, which each includes a first end, a second end and a control end and each includes a body diode, wherein the second ends of the fifth power semiconductor switch and the sixth power semiconductor switch are connected in series in a third phase of the three-phase power supply source. The operating method comprises: acquiring sampled values of first phase voltage of the first phase bridge arm circuit, sampled values of second phase voltage of the second phase bridge arm circuit and sampled values of third phase voltage of the third phase bridge arm circuit; determining direction of a line voltage between the first phase bridge arm circuit and the second phase bridge arm circuit according to the sampled values of the first phase voltage and the sampled values of the second phase voltage, and turning on one of the power semiconductor switches in the first phase bridge arm circuit whose body diode's direction is the same as the direction of the line voltage and one of the power semiconductor switches in the second phase bridge arm circuit whose body diode's direction is the same as the direction of the line voltage; turning on the other of the power semiconductor switches in the first phase bridge arm circuit and the other of the power semiconductor switches in the second phase bridge arm circuit within a half cycle after the immediate zero-crossing of the line voltage, and determining, after the immediate zero-crossing of the line voltage, direction of a voltage across the third phase bridge arm circuit according to the sampled values of the first phase voltage, the sampled values of the second phase voltage and the sampled values of the third phase voltage, and turning on one of the power semiconductor switches in the third phase bridge arm circuit whose body diode's direction is the same as the direction of the voltage; and turning on the other of the power semiconductor switches in the third phase bridge arm circuit within a half cycle after the immediate zero-crossing of the voltage across of the third phase bridge arm circuit.

The solid-state switch devices and the operating methods for such solid-state switch devices according to various aspects of the present disclosure can realize voltage zero-crossing startup, so that the current flowing through the load gradually rises from zero with the generation of impact current being suppressed, thereby avoiding wrong startup of short-circuit protection.

BRIEF DESCRIPTION OF DRAWINGS

The aspects, features and advantages of the present disclosure will become clearer and easier to understand from the following description of the embodiments of the present disclosure in conjunction with the accompanying drawings, in which:

FIG. 5 is a schematic flowchart showing an operating method for a solid-state switch device of a single-phase power supply source according to an embodiment of the present disclosure; and FIG. 6 is a schematic flowchart showing an operating method for a solid-state switch device of a three-phase power supply source according to an embodiment of the present disclosure.

DETAILED DESCRIPTION

Figure 1:
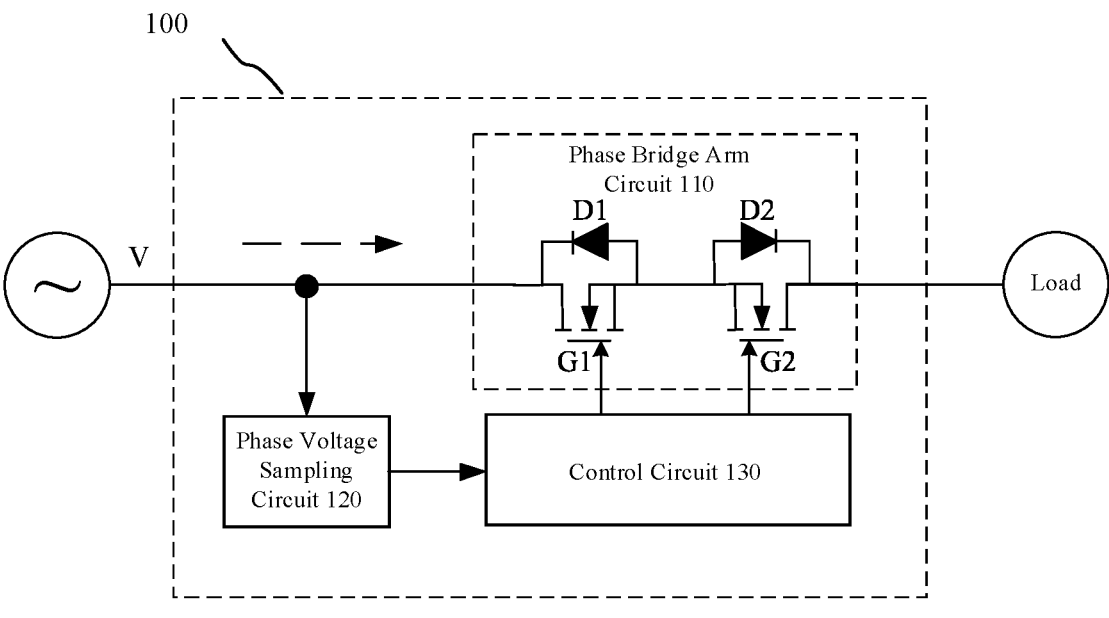
FIG. 1 is a schematic structure showing a solid-state switch device for a single-phase power supply source according to an embodiment of the present disclosure.

The present disclosure will be described in detail below with reference to exemplary embodiments thereof. However, the present disclosure is not limited to the embodiments described herein, and it can be implemented in many different forms. The described embodiments are only used to make the present disclosure thorough and complete, and fully convey the concept of the present disclosure to those skilled in the art. The features of the described embodiments may be combined or substituted with each other unless explicitly excluded or should be excluded according to the context.

Unless otherwise defined, technical or scientific terminologies used in the present disclosure shall have common meanings as understood by those ordinary skilled in the art to which the present disclosure belongs. The terms "first", "second" and the like used in the present disclosure do not indicate any order, quantity or importance, but are only used to distinguish different components.

In the drawings, same reference numerals denote same or similar structural or functional components, regarding which the repetitive descriptions will be omitted in the following description.

As described above, if the solid-state switch is at a high voltage value at the starting time, it may generate a large impact current and cause wrong startup of short-circuit protection. The solid-state switch device according to the embodiments of the present disclosure can realize voltage zero-crossing startup with the impact current being suppressed, thereby avoiding the wrong startup of short-circuit protection.

FIG. 1 is a schematic structure showing a solid-state switch device for a single-phase power supply source according to an embodiment of the present disclosure.

Referring to FIG. 1, a solid-state switch device 100 is connected between a single-phase power supply source and a load. The single-phase power supply power supplies power to the load via the solid-state switch device 100. The solid-state switch device 100 includes a phase bridge arm circuit 110, a phase voltage sampling circuit 120 and a control circuit 130.

The phase bridge arm circuit 110 includes a first power semiconductor switch G1 and a second power semiconductor switch G2. The first power semiconductor switch G1 includes a first end, a second end and a control end and includes a body diode D1. The second power semiconductor switch G2 includes a first end, a second end and a control end and includes a body diode D2. The second ends of the first power semiconductor switch G1 and the second power semiconductor switch G2 are connected in series in phase of the single-phase power supply source.

Each of the first power semiconductor switch G1 and the second power semiconductor switch G2 may be implemented using a metal oxide semiconductor field effect transistor MOSFET or an insulated gate bipolar transistor IGBT. When MOSFET is used, for the first power semiconductor switch G1 or the second power semiconductor switch G2, the first end is a drain, the second end is a source, and the control end is a gate. When IGBT is used, for the first power semiconductor switch G1 or the second power semiconductor switch G2, the first end is a collector, the second end is an emitter, and the control end is a base. As is well known in the art, the direction of the body diode in a MOSFET or IGBT is opposite to the flowing direction when the MOSFET or IGBT is turned on. For example, the direction of the body diode in an N-type MOSFET is from the source to the drain, and the direction of the body diode in a P-type MOSFET is from the drain to the source. For convenience of illustration, the first power semiconductor switch G1 and the second power semiconductor switch G2 are shown as N-type MOSFETs in FIG. 1.

The phase voltage sampling circuit 120 is used to acquire sampled values of phase voltage V applied to the phase bridge circuit 110, for example, by sampling the phase voltage V at a certain sampling frequency (e.g., 48 points/cycle). The phase voltage sampling circuit 120 may be implemented using a voltage transformer, a voltage dividing resistor, an analog-to-digital converter and a digital-toanalog converter, or a combination thereof, or using other known voltage sampling techniques.

The control circuit 130 is connected with the phase voltage sampling circuit 120 to receive the sampled values of the phase voltage V from the phase voltage sampling circuit 120. The control circuit 130 is also connected to the control ends of the first power semiconductor switches G1 and the second power semiconductor switch G2 to turn them on by applying a driving voltage to their control ends. The control circuit 130 may be implemented using, for example, a Microcontroller Unit (MCU) or other combinations of hardware or software.

In order to realize voltage zero-crossing startup, the control circuit 130 determines direction of the phase voltage V according to the sampled values of the phase voltage V, and turns on one of the first power semiconductor switch G1 and the second power semiconductor switch G2 of the phase bridge circuit 110 whose body diode's direction is the same as the direction of the phase voltage V. Then, the other of the first power semiconductor switch G1 and the second power semiconductor switch G2 is turned on within a half cycle after the immediate zero-crossing of the phase voltage V. The operations of the control circuit 130 will be described below in conjunction with FIGS. 1 and 2.

Figure 2:
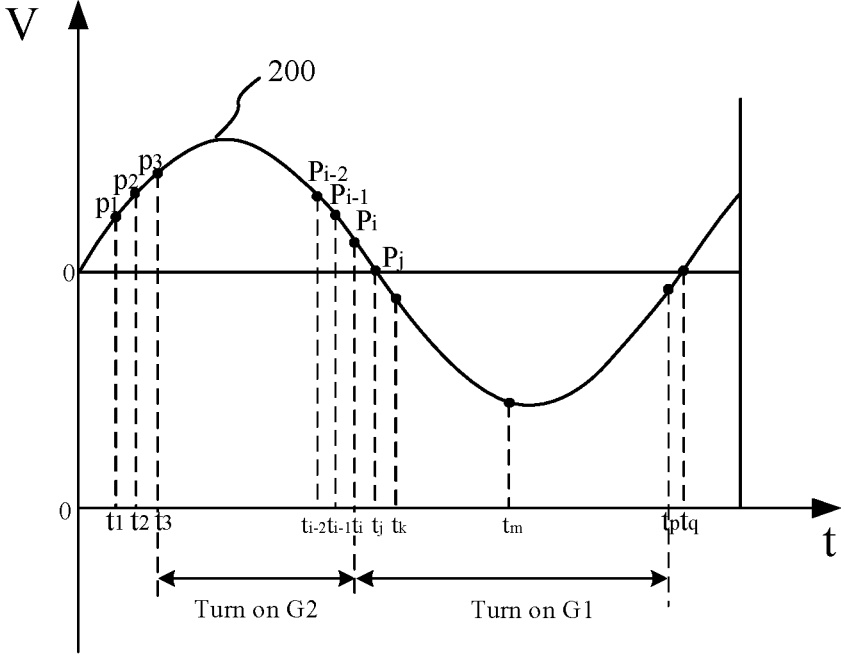
FIG. 2 is an example showing operations of control circuit in FIG. 1.

FIG. 2 is an example showing operations of the control circuit 130 in FIG. 1.

Referring to FIG. 2, curve 200 is a waveform of the phase voltage V fitted by the sampled values of the phase voltage V acquired by the phase voltage sampling circuit 120. The single-phase power supply power is turned on at timing 0, and the phase voltage V is applied to the phase bridge arm circuit 110. The phase voltage sampling circuit 120 acquires the sampled values of the phase voltage V. For example, $p_1$ to $p_3$ shown in FIG. 2 refer to the sampled values of the phase voltage V at timing $t_1$ to $t_3$ respectively, $p_{i-2}$ to $p_i$ refer to the sampled values of the phase voltage V at timing $t_{i-2}$ to $t_i$, and $p_j$ refers to the sampled value of the phase voltage V at timing $t_j$. $p_1$ to $p_3$ are three consecutive sampled values, and $p_{i-2}$ to $p_i$ are three consecutive sampled values.

After the single-phase power supply source is turned on, the control circuit 130 first determines the direction of the phase voltage V, and turns on one of the power semiconductor switches in the first phase bridge circuit 110 whose body diode's direction is the same as the direction of the phase voltage V.

As an implementation, the control circuit 130 may determine the direction of the phase voltage V as a positive direction, i.e., being in the positive half of the cycle, by determining that an average value of the latest predetermined number (e.g., 3) sampled values of the phase voltage V is greater than a predetermined positive threshold T, or determine the direction of the phase voltage V as a negative direction, i.e., being in the negative half of the cycle, by determining that an average value of such sampled values is less than a predetermined positive negative −T. If the average value of the latest predetermined number of sampled values of the phase voltage V is neither greater than the predetermined positive threshold T nor less than the predetermined negative threshold −T, this step will be repeated after the next sampled value of the phase voltage V is generated.

For example, if the latest sampled value of the phase voltage V received by the control circuit 130 is $p_3$ at timing $t_3$, the control circuit 130 takes the latest three consecutive sampled values $p_1$, $p_2$ and $p_3$. By determining that the average value of $p_1$, $p_2$ and $p_3$ is greater than the predetermined positive threshold T, the control circuit 130 determines that the phase voltage V at this moment is in the positive half of the cycle, that is, the direction is the positive direction (as shown by the dashed arrow in FIG. 1). Since the direction of the body diode D2 of the second power semiconductor switch G2 is the same as the direction of the phase voltage V at this moment, the control circuit 130 applies a driving voltage to the control end of the second power semiconductor switch G2 to turn it on.

Timing $t_j$ is the immediate zero-crossing timing of the phase voltage V, and $t_q$ is the next zero-crossing timing after $t_j$. During $t_3$ to $t_j$, the direction of the phase voltage V is the positive direction. Although the second power semiconductor switch G2 is turned on, the first power semiconductor switch G1 is still turned off and the direction of the body diode D1 is also opposite to the direction of the phase voltage V. The phase bridge arm circuit 110 is still opened.

Until timing $t_j$ when the phase voltage V crosses zero, the direction becomes the negative direction, and the direction of the body diode D1 is the same as the direction of the phase voltage V at this moment, then the drain, the source and the body diode D1 of the second power semiconductor switch G2 form a conductive path, the phase bridge arm circuit 110 is closed, and the current gradually rises from zero.

During a half cycle after the zero-crossing timing $t_j$, i.e., before the next zero-crossing timing $t_q$, the control circuit 130 applies a driving voltage to the control end of the first power semiconductor switch G1 to turn it on. Thereafter, the drain and the source of the first power semiconductor switch G1 and the source and the drain of the second power semiconductor switch G2 form a conductive path.

In the above process, the control circuit 130 needs to determine the zero-crossing timing $t_j$ of the phase voltage V. It is easy to understand that since the phase voltage sampling circuit 120 does not necessarily obtain the sampled value of the phase voltage at the zero-crossing timing $t_j$, the control circuit 130 is designed to approximately identify the timings within a certain time range before and after the zero-crossing timing $t_j$ as the zero-crossing timing, which will not affect the suppressing effect on the impact current.

As an implementation, after determining the direction of the phase voltage V as the positive direction, the control circuit 130 determines that the phase voltage V crosses zero by determining that the average value of the latest predetermined number of sampled values of the phase voltage V is less than the predetermined positive threshold T. Alternatively, after determining the direction of the phase voltage V as the negative direction, the control circuit 130 determines that the phase voltage V crosses zero by determining that the average value of the latest predetermined number of sampled values of the phase voltage V is greater than the predetermined negative threshold −T. The predetermined positive threshold T and the predetermined negative threshold −T are selected such that the zero-crossing timing determined in this way is in the vicinity of the exact zero-crossing timing.

For example, as shown in FIG. 2, the control circuit 130 receives a new sampled value $p_i$ of the phase voltage V at timing $t_i$, and takes the latest three sampled values $p_{i-2}$, $p_{i-1}$ and $p_i$ of the phase voltage V. In the case that the average value of $p_{i-2}$, $p_{i-1}$ and $p_i$ is less than the predetermined positive threshold T, the control circuit 130 determines timing $t_i$ as the zero-crossing timing. Although timing $t_i$ may not be equal to the exact zero-crossing timing $t_j$, it is approximate to the exact zero-crossing timing $t_j$. The control circuit 130 will turn on the first power semiconductor switch G1 within half a cycle after timing $t_i$, that is, turn on G1 between timing $t_i$ and timing $t_p$.

As a preferred implementation, the control circuit 130 may also be designed to determine whether the direction of the phase voltage V becomes the negative direction after identifying timing $t_i$ as the zero-crossing timing, and to turn on the first power semiconductor switch G1 only after determining that the direction of the phase voltage V becomes the negative direction. For example, the control circuit 130 determines, after identifying timing $t_i$ as the zero-crossing timing, whether the direction of the phase voltage V becomes the negative direction by calculating whether the average value of the latest three consecutive sampled values is less than the predetermined negative threshold –T. The control circuit 130 turns on the first power semiconductor switch G1 once determining that the phase voltage V enters the negative direction at timing $t_k$.

As another preferred implementation, the control circuit 130 may also be designed to turn on the first power semiconductor switch G1 only at a quarter cycle after identifying timing $t_i$ as the zero-crossing timing, that is, to turn on G1 only when the phase voltage V approaches the peak value in the negative direction. As shown, G1 is turned on at $t_m$.

The above preferred implementation further ensures that G1 is turned on only after the phase voltage practically crosses zero, and other implementations capable of achieving this goal are also possible. In addition, even if the first power semiconductor switch G1 is turned on between timing $t_i$ and timing $t_k$, since the phase voltage V therebetween is already approximate to zero, the current at the time when the phase bridge arm circuit 110 is closed is also approximate to zero, which is sufficient to suppress the impact current.

Here, selecting the average value of consecutive sampled values of the phase voltage to determine the direction and the zero-crossing of the phase voltage is for the purpose of avoiding wrong determination duet to wrong sampled values resulted from interference. The way to determine the voltage direction and the zero-crossing in the present disclosure is not limited to this. For example, a median of multiple sampled values, a sum of multiple sampled values and the like may also be used as reference standards for determination, and the number of sampled values may also be adaptively changed according to the sampling frequency and sampling accuracy of the phase voltage sampling circuit.

As such, the solid-state switch device 100 for the single-phase power supply source according to the embodiment of the present disclosure realizes voltage zero-crossing startup, so that the current flowing through the load gradually rises from zero without the generation of a large impact current, thereby avoiding the wrong startup of short-circuit protection.

Figure 3:
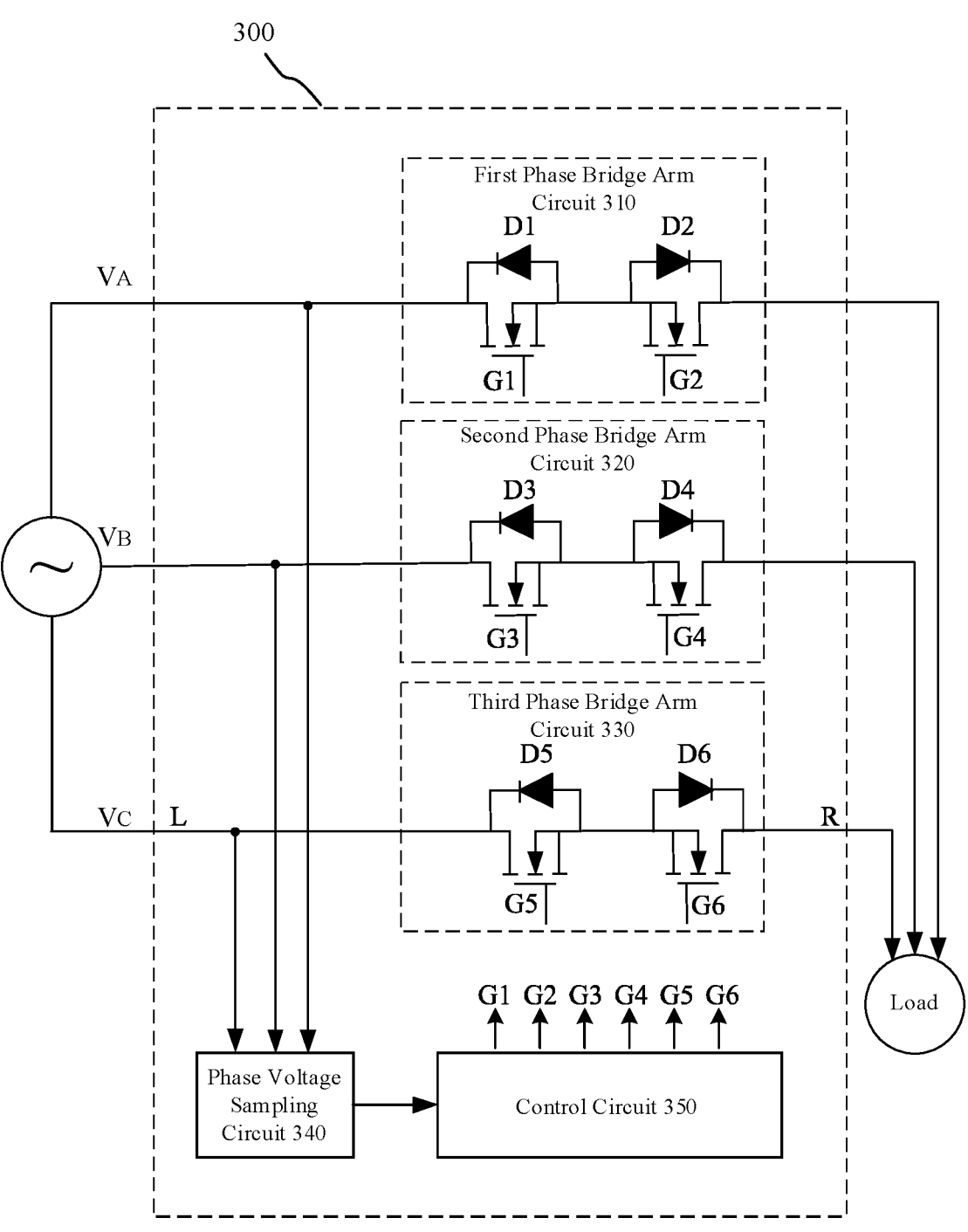
FIG. 3 is a schematic structure showing a solid-state switch device for a three-phase power supply source according to an embodiment of the present disclosure.

FIG. 3 is a structural schematic diagram showing a solid-state switch device for a three-phase power supply source according to an embodiment of the present disclosure.

Referring to FIG. 3, a solid-state switch device 300 for a three-phase power supply source according to an embodiment of the present disclosure is connected between the three-phase power supply source and a load. The solid-state switch device 300 includes a first phase bridge arm circuit 310, a second phase bridge arm circuit 320, a third phase bridge arm circuit 330, a phase voltage sampling circuit 340 and a control circuit 350. The first phase bridge arm circuit 310, the second phase bridge arm circuit 320 and the third phase bridge arm circuit 330 are connected in a star connection.

The first phase bridge arm circuit 310 includes a first power semiconductor switch G1 and a second power semiconductor switch G2. The first power semiconductor switch G1 includes a first end, a second end and a control end and includes a body diode D1. The second power semiconductor switch G2 includes a first end, a second end and a control end and includes a body diode D2. The second ends of the first power semiconductor switch G1 and the second power semiconductor switch G2 are connected in series in phase A of the three-phase power supply source.

The second phase bridge arm circuit 310 includes a third power semiconductor switch G3 and a fourth power semiconductor switch G4. The third power semiconductor switch G3 includes a first end, a second end and a control end and includes a body diode D3. The fourth power semiconductor switch G4 includes a first end, a second end and a control end and includes a body diode D4. The second ends of the third power semiconductor switch G3 and the fourth power semiconductor switch G4 are connected in series in phase B of the three-phase power supply source.

The third phase bridge arm circuit 330 includes a fifth power semiconductor switch G5 and a sixth power semiconductor switch G6. The fifth power semiconductor switch G5 includes a first end, a second end and a control end and includes a body diode D5. The sixth power semiconductor switch G6 includes a first end, a second end and a control end and includes a body diode D6. The second ends of the fifth power semiconductor switch G5 and the sixth power semiconductor switch G6 are connected in series in phase C of the three-phase power supply source.

Similar to the first power semiconductor switch G1 and the second power semiconductor switch G2, each of the first to sixth power semiconductor switches G3 to G6 may also be implemented using a MOSFET or an IGBT, which will not be described repetitively here. For convenience of illustration, the third to sixth power semiconductor switches G3 to G6 are also shown as N-type MOSFETs in FIG. 3.

The phase voltage sampling circuit 340 is used to acquire sampled values of first phase voltage $V_A$ applied to the first phase bridge arm circuit 310, sampled values of second phase voltage $V_B$ applied to the second phase bridge arm circuit 320 and sampled values of third phase voltage $V_C$ applied to the third phase bridge arm circuit 330. The phase voltage sampling circuit 340 may be implemented similarly to the phase voltage sampling circuit 120, which will not be described repetitively here.

In order to realize the voltage zero-crossing startup, the control circuit 350 takes appropriate timings to turn on the first to sixth power semiconductor switches G1 to G6, respectively, according to changes in the voltages of each phase.

Specifically, the control circuit 350 first determines direction of a line voltage $V_{AB}$ between the first phase bridge arm circuit 310 and the second phase bridge arm circuit 320 according to the sampled values of the first phase voltage $V_A$ and the sampled values of the second phase voltage $V_B$, and turns on one of the power semiconductor switches (G1 or G2) in the first phase bridge arm circuit 310 whose body diode's direction is the same as the direction of the line voltage $V_{AB}$ and one of the power semiconductor switches (G3 or G4) in the second phase bridge arm circuit 320 whose body diode's direction is the same as the direction of the line voltage $V_{AB}$. The control circuit 350 turns on, within a half cycle after the immediate zero-crossing of the line voltage $V_{AB}$, the other of the power semiconductor switches (G2 or G1) in the first phase bridge arm circuit 310 and the other of the power semiconductor switches (G4 or G3) in the second phase bridge arm circuit 320. Furthermore, the control circuit 350 determines, after the immediate zero-crossing of the line voltage $V_{AB}$, direction of a voltage across the third phase bridge arm circuit 330 according to the sampled values of the first phase voltage $V_A$, the sampled values of the second phase voltage $V_B$ and the sampled values of the third phase voltage $V_C$, and turns on one of the power semiconductor switches (G5 or G6) in the third phase bridge arm circuit 330 whose body diode's direction is the same as the direction of the voltage across the third phase bridge arm circuit 330. Then, the control circuit 350 turns on, within a half cycle after the immediate zero-crossing of the voltage across the third phase bridge arm circuit 330, the other of the power semiconductor switches (G6 or G5) in the third phase bridge arm circuit 330. The operations of the control circuit 350 will be described below in conjunction with FIGS. 3 and 4.

Figure 4:
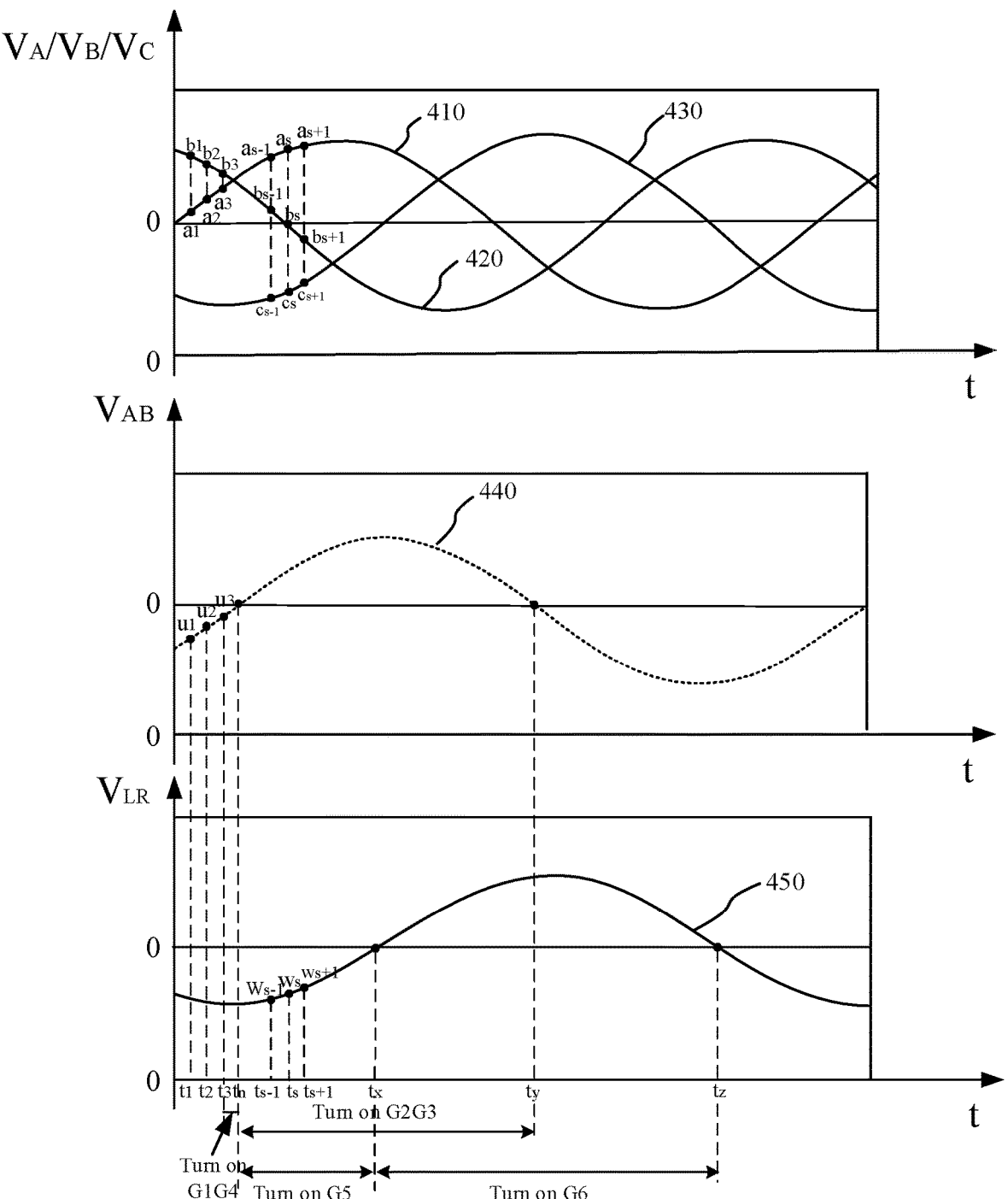
FIG. 4 is an example showing operations of control circuit in FIG. 3.

FIG. 4 is an example showing operations of the control circuit 350 in FIG. 3.

Referring to FIG. 4, curves 410, 420, and 430 are a waveform of the first phase voltage $V_A$, a waveform of the second phase voltage $V_B$, and a waveform of the third phase voltage $V_C$ fitted by the sampled values of the first phase voltage $V_A$, the sampled values of the second phase voltage $V_B$, and the sampled values of the third phase voltage $V_C$ acquired by the phase voltage sampling circuit 340, respectively. Curve 440 is a waveform of the line voltage $V_{AB}$ between phase A and phase B derived from curve 410 and curve 420. Curve 450 is a waveform of the voltage $V_{LR}$ across phase C derived from curve 410, curve 420 and curve 430. In FIG. 4, the two ends of the third phase bridge arm circuit 330 are denoted by reference numerals L and R, respectively.

The three-phase power supply source is turned on at timing 0, and the first to third phase voltages $V_A$, $V_B$ and $V_C$ are applied to the phase bridge arm circuits 310, 320 and 330, respectively. The phase voltage sampling circuit 340 acquires sampled values of each phase voltage. For example, $a_1$ to $a_3$ shown in FIG. 4 refer to the sampled values of the phase voltage $V_A$ at timing $t_1$ to $t_3$, respectively, and $b_1$ to $b_3$ refer to the sampled values of the phase voltage $V_B$ at timing $t_1$ to $t_3$, respectively. From the sampled values $a_1$ to $a_3$ and $b_1$ to $b_3$, the sampled values $u_1$ to $u_3$ of the line voltage $V_{AB}$ between both A phase and B phase respectively corresponding to timing $t_1$ to $t_3$, can be derived. Wherein $a_1$ to $a_3$ are three consecutive sampled values, and $b_1$ to $b_3$ are three consecutive sampled values.

After the three-phase power supply source is turned on, the control circuit 350 first determines the direction of the line voltage $V_{AB}$ between the first phase bridge arm circuit 310 and the second phase bridge arm circuit 320 according to the sampled values of the first phase voltage $V_A$ and the sampled values of the second phase voltage $V_B$.

As an implementation, the control circuit 350 may derive the latest predetermined number (e.g., 3) of sampled values of the line voltage $V_{AB}$ from the latest predetermined number of sampled values of the first phase voltage $V_A$ and the latest predetermined number of sampled values of the second phase voltage $V_B$. Then, if the average value of the latest predetermined number of sampled values of line voltages $V_{AB}$ is greater than the predetermined positive threshold T, it is determined that the direction of the line voltage $V_{AB}$ is the positive direction, i.e., from phase A to phase B. If the average value of the latest predetermined number of sampled values of the line voltages $V_{AB}$ is less than the predetermined negative threshold –T, it is determined that the direction of the line voltage $V_{AB}$ is the negative direction, i.e., from phase B to phase A. If the average value of the latest predetermined number of sampled values of the line voltages $V_{AB}$ is neither greater than the positive threshold T nor less than the negative threshold –T, this step will be repeated after the next sampled value of the line voltage $V_{AB}$ is generated.

For example, the control circuit 350 receives the latest sampled value $a_3$ of the phase voltage $V_A$ and the latest sampled value $b_3$ of the phase voltage $V_B$ at timing $t_3$. The control circuit 350 takes the latest three sampled values $a_1$, $a_2$ and $a_3$ of the first phase voltage $V_A$ and the latest three sampled values $b_1$, $b_2$ and $b_3$ of the second phase voltage $V_B$, and derives the latest three sampled values of the line voltage $V_{AB}$, i.e., $u_1=a_1-b_1$, $u_2=a_2-b_2$ and $u_3=a_3-b_3$. In the case that the average value of $u_1$, $u_2$ and $u_3$ is less than the predetermined negative threshold –T, the control circuit 350 determines the direction of the line voltage $V_{AB}$ as the negative direction, i.e., from phase B to phase A. Since the directions of the body diode D1 of the first power semiconductor switch G1 in the first phase bridge arm circuit 310 and the body diode D4 of the fourth power semiconductor switch G4 in the second phase bridge arm circuit 320 are the same as the direction from phase B to phase A, the control circuit 350 turns on the first power semiconductor switch G1 and the fourth power semiconductor switch G4 by applying a driving voltage to the control ends of G1 and G4.

Timing $t_n$ is the immediate zero-crossing timing of the line voltage $V_{AB}$, and timing $t_y$ is the next zero-crossing timing of the line voltage $V_{AB}$. During $t_3$ to $t_n$, although the first power semiconductor switch G1 and the fourth power semiconductor switch G4 are turned on, the second power semiconductor switch G2 and the third power semiconductor switch G3 are still turned off and the directions of their body diodes D2 and D3 are opposite to the second direction, and the first phase bridge arm circuit 310 and the second phase bridge arm circuit 320 are still opened.

At timing $t_n$, the line voltage $V_{AB}$ crosses zero, and the direction becomes the positive direction, i.e., from phase A to phase B. At this moment, since the directions of the body diodes D2 and D3 are the same as the direction from phase A to phase B, in the first phase bridge arm circuit 310, a conductive path is formed by the source and the drain of the first power semiconductor switch G1 and the body diode D2 of the second power semiconductor switch G2, and in the second phase bridge arm circuit 320, a conductive path is formed by the body diode D3 of the third power semiconductor switch G3 and the source and the drain of the fourth power semiconductor switch G4. The first phase bridge arm circuit 310 and the second phase bridge arm circuit 320 are closed and the current gradually rises from zero.

The second power semiconductor switch G2 in the first phase bridge arm circuit 310 and the third power semiconductor switch G3 in the second phase bridge arm circuit are turned on within a half cycle after timing $t_n$, e.g., between timing $t_n$ and timing $t_y$. Thereafter, in the first phase bridge arm circuit 310, a conductive path is formed by the first power semiconductor switch G1 and the second power semiconductor switch G2, and in the second phase bridge arm circuit 320, a conductive path is formed by the third power semiconductor switch G3 and the fourth power semiconductor switch G4.

Next, with regard to the third phase bridge arm circuit 330, after the first phase bridge arm circuit 310 and the second phase bridge arm circuit 320 are closed at timing $t_n$, the control circuit 350 may determine the direction of the voltage $V_{LR}$ across the third phase bridge arm circuit 330 according to the sampled values of the first phase voltage $V_A$, the sampled values of the second phase voltage $V_B$ and the sampled values of the third phase voltage $V_C$, and turn on one of the power semiconductor switches in the third phase bridge arm circuit 330 whose body diode's direction is the same as the direction of the voltage $V_{LR}$.

As shown in FIG. 4, at timing $t_{s+1}$, the control circuit 350 derives the latest three sampled values, $w_{s-1}=c_{s-1}-0.5*(a_{s-1}+b_{s-1})$, $w_s=c_s-0.5*(a_s+b_s)$ and $w_{s+1}=c_{s+1}-0.5*(a_{s+1}+b_{s+1})$, of the voltage $V_{LR}$ across the third phase bridge arm circuit 330 from the latest three sampled values $a_{s-1}$, $a_s$ and $a_{s+1}$ of the first phase voltage $V_A$, the latest three sampled values $b_{s-1}$, $b_s$ and $b_{s+1}$ of the second phase voltage $V_B$ and the latest three sampled values $c_{s-1}$, $c_s$ and $c_{s+1}$ of the third phase voltage $V_C$. In the case that the average value of $w_{s-1}$, $w_s$ and $w_{s+1}$ is less than the predetermined negative threshold $-T$, the control circuit 350 determines the direction of the voltage $V_{LR}$ across the third phase bridge arm circuit 330 as the negative direction, e.g., from the R end to the L end. At this moment, when the direction of the body diode D5 is the same as the direction of the voltage $V_{LR}$, the control circuit 350 turns on the fifth power semiconductor switch G5 by applying a driving voltage to the control end of G5.

Timing $t_x$ is the immediate zero-crossing timing of the voltage $V_{LR}$ across the third phase bridge arm circuit 330, and timing $t_z$ is the next zero-crossing timing. At timing $t_x$, the voltage $V_{LR}$ across the third phase bridge arm circuit 330 crosses zero, and the direction becomes the positive direction, e.g., from the L end to the R end. At this moment, since the direction of the body diode D6 is the same as the direction of the voltage $V_{LR}$, the drain, the source and the body diode D6 of the fifth power semiconductor switch G5 form a conductive path. The third phase bridge arm circuit 330 is closed and the current gradually rises from zero.

Within a half cycle after timing $t_x$, e.g., before the next zero-crossing timing $t_z$ of the voltage $V_{LR}$ across the third phase bridge arm circuit 330, the control circuit 350 applies a driving voltage to the control end of the sixth power semiconductor switch G6 to turn it on. Thereafter, in the third phase bridge arm circuit 330, a conductive path is formed by the drain and the source of the fifth power semiconductor switch G5 and the source and the drain of the sixth power semiconductor switch G6.

In the above process, the control circuit 350 needs to determine the zero-crossing timing of the line voltage $V_{AB}$ between phase A and phase B and the zero-crossing timing of the voltage across the third phase bridge arm circuit 330. It is easy to understand that since the phase voltage sampling circuit 340 does not necessarily obtain the sampled values of each phase voltage at exact zero-crossing timing $t_n$ and $t_x$, the control circuit 350 is designed to approximately identify the timings within a certain time range before and after the exact zero-crossing timing $t_n$ and $t_x$, which will not affect the suppressing effect on the impact current.

As an implementation, after determining the direction of the line voltage $V_{AB}$ as the positive direction, the control circuit 350 determines that the line voltage $V_{AB}$ crosses zero by determining that the average value of the latest predetermined number of sampled values of the line voltage $V_{AB}$ is less than a predetermined positive threshold T. Alternatively, after determining the direction of the line voltage $V_{AB}$ as the negative direction, the control circuit 350 determines that the line voltage $V_{AB}$ crosses zero by determining that the average value of the latest predetermined number of sampled values of the line voltage $V_{AB}$ is less than a predetermined negative threshold $-T$.

In this example, the control circuit 350 has determined the direction of the line voltage $V_{AB}$ as the negative direction at timing $t_3$ and turned on the first power semiconductor switch G1 and the fourth power semiconductor switch G4. Thereafter, the control circuit 350 derives a new sampled value of the line voltage $V_{AB}$ whenever it receives new sampled values of the first and second phase voltages $V_A$ and $V_B$. Then, it is determined that the line voltage $V_{AB}$ crosses zero by determining that the average value of the latest predetermined number of sampled values of the line voltage $V_{AB}$ at this moment is less than the predetermined threshold T.

As an implementation, after determining the direction of the voltage $V_{LR}$ across the third phase bridge arm circuit 330 as the positive direction, it is determined that the voltage across the third phase bridge arm circuit 330 crosses zero by determining that the average value of the latest predetermined number of sampled values of the voltage across the third phase bridge arm circuit 330 is less than the predetermined positive threshold T. Alternatively, after determining the direction of the voltage $V_{LR}$ across the third phase bridge arm circuit 330 as the negative direction, it is determined that the voltage across the third phase bridge arm circuit crosses zero by determining that the average value of the latest predetermined number of sampled values of the voltage $V_{LR}$ across the third phase bridge arm circuit 330 is greater than the predetermined negative threshold $-T$.

In this example, the control circuit 350 has determined the direction of the voltage $V_{LR}$ across the third phase bridge arm circuit 330 as the negative direction at timing $t_{s+1}$, e.g., from the R end to the L end, and turned on the fifth power semiconductor switch G5. Thereafter, the control circuit 350 derives a new sampled value of the voltage $V_{LR}$ whenever it receives new sampled values of the first, second and third phase voltages $V_A$, $V_B$ and $V_C$. Then, it is determined that the voltage $V_{LR}$ crosses zero by determining that the average value of the latest predetermined number of sampled values of the voltage $V_{LR}$ at this moment is greater than the predetermined negative threshold $-T$.

This is the same as the principle described in conjunction with FIG. 2 that the control circuit 130 determines that the phase voltage V crosses zero according to the average value of the sampled values $p_{i-2}$, $p_{i-1}$ and $p_i$ of the phase voltage V being less than the predetermined positive threshold T, which will no longer be detailed.

As a preferred implementation, in the example of FIG. 4, the control circuit 350 may be designed to determine whether the line voltage $V_{AB}$ is reversed after determining that the line voltage $V_{AB}$ crosses zero, and to turn on the second power semiconductor switch G2 and the third power semiconductor switch G3 only after determining that the line voltage $V_{AB}$ is reversed. As another preferred implementation, the control circuit 350 may also be designed to turn on the second power semiconductor switch G2 and the third power semiconductor switch G3 only at a quarter cycle after determining that the line voltage $V_{AB}$ crosses zero. These preferred implementations further ensure that G2 and G3 are turned on only after the line voltage $V_{AB}$ practically crosses zero.

Similarly, as a preferred implementation, the control circuit 350 may also be designed to determine whether the voltage $V_{LR}$ across the third phase bridge arm circuit 330 is reversed after determining that the voltage $V_{LR}$ crosses zero, and to turn on the sixth power semiconductor switch G6 only after determining that the voltage $V_{LR}$ is reversed. As another preferred implementation, the control circuit 350 may also be designed to turn on the sixth power semiconductor switch G6 only at a quarter cycle after determining that the voltage $V_{LR}$ across the third phase bridge arm circuit 330 crosses zero. These preferred implementations further ensure that G6 is turned on only after the voltage $V_{LR}$ practically crosses zero.

As a result, in the solid-state switch device 300 for a three-phase power supply source according to the embodiment of the present disclosure, the currents generated after the first to third phase bridge arm circuits 310 to 330 are closed gradually rise from zero, thereby avoiding the wrong startup of short-circuit protection due to impact current.

Although FIGS. 3 and 4 are illustrated with the first phase bridge arm circuit 310, the second phase bridge arm circuit 320 and the third phase bridge arm circuit 330 as a star connection, the present disclosure is not limited to this. When the first phase bridge arm circuit 310, the second phase bridge arm circuit 320, and the third phase bridge arm circuit 330 are connected in a delta connection or otherwise, based on the concept of the present disclosure, it is also possible to realize voltage zero-crossing startup by turning on respective power semiconductor switches in respective phase bridge arm circuits at different timings according to changes in the voltage of each phase.

The solid-state switch devices for single-phase and three-phase power supply sources are described above, and the operating methods of such solid-state switch devices are described below.

FIG. 5 is a schematic flowchart illustrating an operating method of a solid-state switch device for a single-phase power supply source according to an embodiment of the present disclosure.

The solid-state switch device for the single-phase power supply source can be the solid-state switch device 100 shown in FIG. 1, and the operating method 500 thereof includes steps S510 to S530.

In step S510, the sampled values of the phase voltage of the phase bridge arm circuit are acquired. For example, in the previous example described in conjunction with FIGS. 1 and 2, the sampled values $p_1$, $p_2$ and $p_3$ of the phase voltage V of the phase bridge arm circuit 110 are acquired by the phase voltage sampling circuit 120.

In step S520, the direction of the phase voltage is determined according to the sampled values of the phase voltage, and one of the power semiconductor switches in the phase bridge arm circuit 110 whose body diode's direction is the same as the direction of the phase voltage is turned on. For example, in the previous example described in conjunction with FIG. 1 and FIG. 2, the control circuit 130 determines the direction of the phase voltage V as the positive direction according to the average value of the acquired latest three sampled values $p_1$, $p_2$ and $p_3$ of the phase voltage is greater than the predetermined positive threshold, and thus turns on the second power semiconductor switch G2.

In step S530, the other of the power semiconductor switches in the phase bridge arm circuit 110 is turned on within a half cycle after the immediate zero-crossing of the phase voltage V. For example, in the previous example described in conjunction with FIGS. 1 and 2, the control circuit 130 determines that the phase voltage V crosses zero at timing $t_i$ by determining that the average value of the latest three sampled values $p_{i-2}$, $p_{i-1}$ and $p_i$ of the phase voltage V is less than the predetermined positive threshold T, and turns on the first power semiconductor switch G1 within a half cycle after timing $t_i$.

As such, the phase bridge arm circuit 110 is closed when the phase voltage crosses zero, and the solid-state switch device 100 realizes voltage zero-crossing startup, so that the current flowing through the load gradually rises from zero without the generation of large impact current.

A part of the operating method 500 is described above only in conjunction with FIG. 5, and the operating method 500 can make reference to various aspects of the aforementioned solid-state switch device 100 and related drawings. For example, various aspects of the aforementioned solid-state switch device 100 may be modified to implement one or more steps of the operating method 500, which will no longer be detailed here for avoiding repetition.

FIG. 6 is a schematic flowchart illustrating an operating method of a solid-state switch device for a three-phase power supply source according to an embodiment of the present disclosure.

The solid-state switch device for the three-phase power supply source can be the solid-state switch device 300 shown in FIG. 3, and the operating method 600 thereof includes steps S610 to S640.

In step S610, the sampled values of the first phase voltage of the first phase bridge arm circuit, the sampled values of the second phase voltage of the second phase bridge arm circuit and the sampled values of the third phase voltage of the third phase bridge arm circuit are acquired. For example, in the previous example described in conjunction with FIGS. 3 and 4, the phase voltage sampling circuit 340 acquires the sampled values $a_1$, $a_2$ and $a_3$ of the first phase voltage $V_A$, the sampled values $b_1$, $b_2$ and $b_3$ of the second phase voltage $V_B$ and the sampled values c1, c2 and c3 of the third phase voltage $V_C$ of the first phase bridge arm circuit 310, the second phase bridge arm circuit 320 and the third phase bridge arm circuit 330, respectively.

In step S620, the direction of the line voltage between the first phase bridge arm circuit and the second phase bridge arm circuit is determined according to the sampled values of the first phase voltage and the sampled values of the second phase voltage, and one of the power semiconductor switches in the first phase bridge arm circuit whose body diode's direction is the same as the direction of the line voltage and one of the power semiconductor switches in the second phase bridge arm circuit whose body diode's direction is the same as the direction of the line voltage are turned on. For example, in the previous example described in conjunction with FIGS. 3 and 4, the control circuit 350 derives the latest three sampling values $u_1$, $u_2$ and $u_3$ of the line voltage $V_{AB}$ between the first phase bridge arm circuit 310 and the second phase bridge arm circuit 320 from the latest three sampled values $a_1$, $a_2$ and $a_3$ of the first phase voltage $V_A$ and the latest three sampled values $b_1$, $b_2$ and $b_3$ of the second phase voltage $V_B$. Since $u_1$, $u_2$ and $u_3$ are all less than zero, the control circuit 350 determines that the direction of the line voltage $V_{AB}$ is the negative direction from phase B to phase A, and then turns on the first power semiconductor switch G1 and the fourth power semiconductor switch G4.

In step S630, the other of the power semiconductor switches in the first phase bridge arm circuit and the other of the power semiconductor switches in the second phase bridge arm circuit are turned on within a half cycle after the immediate zero-crossing of the line voltage, and after the immediate zero-crossing of the line voltage, the direction of the voltage across the third phase bridge arm circuit is determined according to the sampled values of the first phase voltage, the sampled values of the second phase voltage and the sampled values of the third phase voltage, and one of the power semiconductor switches in third phase bridge arm circuit whose body diode's direction is the same as the direction of the voltage is turned on. For example, in the previous example described in conjunction with FIGS. 3 and 4, the control circuit 350 derives the latest three sampled values $w_{s-1}$, $w_s$ and $w_{s+1}$ of the voltage $V_{LR}$ across the third phase bridge arm circuit 330 from the latest three sampled values $a_{s-1}$, $a_s$ and $a_{s+1}$ of the first phase voltage $V_A$, the latest three sampled values $b_{s-1}$, $b_s$ and $b_{s+1}$ of the second phase voltage $V_B$ and the latest three sampled values $c_{s-1}$, $c_s$ and $c_{s+1}$ of the third phase voltage $V_C$. Since the sampled values $w_{s-1}$, $w_s$ and $w_{s+1}$ are all less than zero, the control circuit 350 determines that the direction of the voltage $V_{LR}$ across the third phase bridge arm circuit 330 is from the R end to the L end, and then turns on the fifth power semiconductor switch G5.

In step S640, the other of the power semiconductor switches in the third phase bridge arm circuit is turned on within a half cycle after the immediate zero-crossing of the voltage across the third phase bridge arm circuit. For example, in the previous example described above in conjunction with FIGS. 3 and 4, the control circuit 350 turns on the sixth power semiconductor switch G6 within a half cycle after the immediate zero-crossing of the voltage $V_{LR}$ across the third phase bridge arm circuit 330.

As such, the currents generated after the first to third phase bridge arm circuits 310 to 330 in the solid-state switch device 300 are closed gradually rise from zero, without the generation of large impact current, thereby avoiding the wrong startup of short-circuit protection.

A part of the operating method 600 is described above only with reference to FIG. 6, and the operating method 600 can make reference to various aspects of the aforementioned solid-state switch device 300 and related drawings. For example, the aforementioned solid-state switch device 300 and various aspects thereof may be modified to implement one or more steps of the operating method 600, which will no longer be detailed here for avoiding repetition.

The solid-state switch device 100 and the operating method 500 thereof, the solid-state switch device 300 and the operating method 600 thereof according to the embodiments of the present disclosure can realize the voltage zero-crossing startup, so that the current flowing through the load gradually rises from zero, thereby avoiding the wrong startup of short-circuit protection due to large impact current.

It should be understood by those skilled in the art that the above-described specific embodiments are only examples rather than limitations, and various modifications, combinations, partial combinations and substitutions can be made to the embodiments of the present disclosure according to design requirements and other factors, as long as they are within the scope of the appended claims or their equivalents, that is, belong to the claimed protection scope of the present disclosure.

What is claimed is:

1. A solid-state switch device connected between a single-phase power supply source and a load, comprising:
a phase bridge arm circuit, including a first power semiconductor switch and a second power semiconductor switch, which each includes a first end, a second end and a control end and each includes a body diode, wherein the second ends of the first power semiconductor switch and the second power semiconductor switch are connected in series in phase of a single-phase power supply source;
a phase voltage sampling circuit, configured to acquire sampled values of phase voltage of the phase bridge arm circuit; and
a control circuit, configured to determine direction of the phase voltage according to the sampled values of the phase voltage, turn on one of the power semiconductor switches in the phase bridge arm circuit whose body diode' direction is the same as the direction of the phase voltage, and turn on the other of the power semiconductor switches in the phase bridge arm circuit within a half cycle after the immediate zero-crossing of the phase voltage.

2. The solid-state switch device according to claim 1, wherein
each of the first power semiconductor switch and the second power semiconductor switch is a metal oxide semiconductor field effect transistor, and the first end, the second end and the control end are a drain, a source and a gate, respectively; or
each of the first power semiconductor switch and the second power semiconductor switch is an insulated gate bipolar transistor, and the first end, the second end and the control end are a collector, an emitter and a base, respectively.

3. The solid-state switch device according to claim 1, wherein
the control circuit is configured to determine the direction of the phase voltage as a positive direction by determining that an average value of the latest predetermined number of sampled values of the phase voltage is greater than a predetermined positive threshold, or determine the direction of the phase voltage as a negative direction by determining that an average value of the latest predetermined number of sampled values of the phase voltage is less than a predetermined negative threshold.

4. The solid-state switch device according to claim 3, wherein
after determining the direction of the phase voltage as the positive direction, the control circuit is configured to determine that the phase voltage crosses zero by determining that the average value of the latest predetermined number of sampled values of the phase voltage is less than the predetermined positive threshold; or
after determining the direction of the phase voltage as the negative direction, the control circuit is configured to determine that the phase voltage crosses zero by determining that the average value of the latest predetermined number of sampled values of the phase voltage is greater than the predetermined negative threshold.

5. A solid-state switch device connected between a three-phase power supply source and a load, comprising:
a first phase bridge arm circuit, including a first power semiconductor switch and a second power semiconductor switch, which each includes a first end, a second end and a control end and each includes a body diode, wherein the second ends of the first power semiconductor switch and the second power semiconductor switch are connected in series in a first phase of the three-phase power supply source;
a second phase bridge arm circuit, including a third power semiconductor switch and a fourth power semiconductor switch, which each includes a first end, a second end and a control end and each includes a body diode, wherein the second ends of the third power semiconductor switch and the fourth power semiconductor switch are connected in series in a second phase of the three-phase power supply source;
a third phase bridge arm circuit, including a fifth power semiconductor switch and a sixth power semiconductor switch, which each includes a first end, a second end and a control end and each includes a body diode, wherein the second ends of the fifth power semiconductor switch and the sixth power semiconductor switch are connected in series in a third phase of the three-phase power supply source;

a phase voltage sampling circuit, configured to acquire sampled values of first phase voltage of the first phase bridge arm circuit, sampled values of second phase voltage of the second phase bridge arm circuit and sampled values of third phase voltage of the third phase bridge arm circuit; and a control circuit, configured to performs the following operations:

determining direction of a line voltage between the first phase bridge arm circuit and the second phase bridge arm circuit according to the sampled values of the first phase voltage and the sampled values of the second phase voltage, and turning on one of the power semiconductor switches in the first phase bridge arm circuit whose body diode's direction is the same as the direction of the line voltage and one of the power semiconductor switches in the second phase bridge arm circuit whose body diode's direction is the same as the direction of the line voltage;

turning on the other of the power semiconductor switches in the first phase bridge arm circuit and the other of the power semiconductor switches in the second phase bridge arm circuit within a half cycle after the immediate zero-crossing of the line voltage, and determining, after the immediate zero-crossing of the line voltage, direction of a voltage across the third phase bridge arm circuit according to the sampled values of the first phase voltage, the sampled values of the second phase voltage and the sampled values of the third phase voltage, and turning on one of the power semiconductor switches in the third phase bridge arm circuit whose body diode's direction is the same as the direction of the voltage; and turning on the other of the power semiconductor switches in the third phase bridge arm circuit within a half cycle after the immediate zero-crossing of the voltage across the third phase bridge arm circuit, wherein the first phase bridge arm circuit, the second phase bridge arm circuit and the third phase bridge arm circuit are connected in a star connection.

6. The solid-state switch device according to claim 5, wherein each of the first to sixth power semiconductor switches is a metal oxide semiconductor field effect transistor, and the first end, the second end and the control end are a drain, a source and a gate, respectively; or each of the first to sixth power semiconductor switches is an insulated gate bipolar transistor, and the first end, the second end and the control end are a collector, an emitter and a base, respectively.

7. The solid-state switch device according to claim 5, wherein the control circuit is configured to derive the latest predetermined number of sampled values of the line voltage from the latest predetermined number of sampled values of the first phase voltage and the latest predetermined number of sampled values of the second phase voltage, and determine the direction of the line voltage as a positive direction by determining that an average value of the latest predetermined number of sampled values of the line voltage is greater than a predetermined positive threshold, or determine the direction of the line voltage as a negative direction by determining that an average value of the latest predetermined number of sampled values of the line voltage is less than a predetermined negative threshold.

8. The solid-state switch device according to claim 5, wherein the control circuit is configured to derive the latest predetermined number of sampled values of the voltage across the third phase bridge arm circuit from the latest predetermined number of sampled values of the first phase voltage, the latest predetermined number of sampled values of the second phase voltage and the latest predetermined number of sampled values of the third voltage, and determine that the direction of the voltage across the third phase bridge arm circuit is a positive direction by determining that an average value of the latest predetermined number of sampled values of the voltage across the third phase bridge arm circuit is greater than a predetermined positive threshold, or determine that the direction of the voltage across the third phase bridge arm circuit as a negative direction by determining that an average value of the latest predetermined number of sampled values of the voltage across the third phase bridge arm circuit is less than a predetermined negative threshold.

9. The solid-state switch device according to claim 7, wherein after determining the direction of the line voltage as the positive direction, the control circuit is configured to determine that the line voltage crosses zero by determining that the average value of the latest predetermined number of sampled values of the line voltage is less than the predetermined positive threshold; or after determining the direction of the line voltage as the negative direction, the control circuit is configured to determine that the line voltage crosses zero by determining that the average value of the latest predetermined number of sampled values of the line voltage is greater than the predetermined negative threshold.

10. The solid-state switch device according to claim 8, wherein after determining the direction of the voltage across the third phase bridge arm circuit as the positive direction, the control circuit is configured to determine that the voltage across the third phase bridge arm circuit crosses zero by determining that the average value of the latest predetermined number of sampled values of the voltage across the third phase bridge arm circuit is less than the predetermined positive threshold; or after determining the direction of the voltage across the third phase bridge arm circuit as the negative direction, the control circuit is configured to determine that the voltage across the third phase bridge arm circuit crosses zero by determining that the average value of the latest predetermined number of sampled values of the voltage across the third phase bridge arm circuit is greater than the predetermined negative threshold.

11. An operating method for a solid-state switch device connected between a three-phase power supply source and a load, wherein the solid-state switch device includes a first phase bridge arm circuit, a second phase bridge arm circuit and a third phase bridge arm circuit which are connected in a star connection, the first phase bridge arm circuit includes a first power semiconductor switch and a second power semiconductor switch, which each includes a first end, a second end and a control end and each includes a body diode, wherein the second ends of the first power semiconductor switch and the second power semiconductor switch are connected in series in a first phase of the three-phase power supply source, the second phase bridge arm circuit includes a third power semiconductor switch and a fourth power semiconductor switch, which each includes a first end, a second end and a control end and each includes a body diode, wherein the second ends of the third power semiconductor switch and the fourth power semiconductor switch are connected in series in a second phase of the three-phase power supply source, and the third phase bridge arm circuit includes a fifth power semiconductor switch and a sixth power semiconductor switch, which each includes a first end, a second end and a control end and each includes a body diode, wherein the second ends of the fifth power semiconductor switch and the sixth power semiconductor switch are connected in series in a third phase of the three-phase power supply source, the operating method comprising:

acquiring sampled values of first phase voltage of the first phase bridge arm circuit, sampled values of second phase voltage of the second phase bridge arm circuit and sampled values of third phase voltage of the third phase bridge arm circuit;

determining direction of a line voltage between the first phase bridge arm circuit and the second phase bridge arm circuit according to the sampled values of the first phase voltage and the sampled values of the second phase voltage, and turning on one of the power semiconductor switches in the first phase bridge arm circuit whose body diode's direction is the same as the direction of the line voltage and one of the power semiconductor switches in the second phase bridge arm circuit whose body diode's direction is the same as the direction of the line voltage;

turning on the other of the power semiconductor switches in the first phase bridge arm circuit and the other of the power semiconductor switches in the second phase bridge arm circuit within a half cycle after the immediate zero-crossing of the line voltage, and determining, after the immediate zero-crossing of the line voltage, direction of a voltage across the third phase bridge arm circuit according to the sampled values of the first phase voltage, the sampled values of the second phase voltage and the sampled values of the third phase voltage, and turning on one of the power semiconductor switches in the third phase bridge arm circuit whose body diode's direction is the same as the direction of the voltage; and turning on the other of the power semiconductor switches in the third phase bridge arm circuit within a half cycle after the immediate zero-crossing of the voltage across of the third phase bridge arm circuit.

12. The operating method according to claim 11, wherein determining the direction of the line voltage comprises:

deriving the latest predetermined number of sampled values of the line voltage from the latest predetermined number of sampled values of the first phase voltage and the latest predetermined number of sampled values of the second phase voltage, and determining the direction of the line voltage as a positive direction by determining that an average value of the latest predetermined number of sampled values of the line voltage is greater than a predetermined positive threshold, or determining the direction of the line voltage as a negative direction by determining that an average value of the latest predetermined number of sampled values of the line voltage is less than a predetermined negative threshold.

13. The operating method according to claim 11, wherein determining the direction of the voltage across the third phase bridge arm circuit comprises:

deriving the latest predetermined number of sampled values of the voltage across the third phase bridge arm circuit from the latest predetermined number of sampled values of the first phase voltage, the latest predetermined number of sampled values of the second phase voltage and the latest predetermined number of sampled values of the third voltage, and determining that the direction of the voltage across the third phase bridge arm circuit is a positive direction by determining that an average value of the latest predetermined number of sampled values of the voltage across the third phase bridge arm circuit is greater than a predetermined positive threshold, or determining that the direction of the voltage across the third phase bridge arm circuit as a negative direction by determining that an average value of the latest predetermined number of sampled values of the voltage across the third phase bridge arm circuit is less than a predetermined negative threshold.

14. The operating method according to claim 11, wherein after determining the direction of the line voltage as the positive direction, it is determined that the line voltage crosses zero by determining that the average value of the latest predetermined number of sampled values of the line voltage is less than the predetermined positive threshold; or after determining the direction of the line voltage as the negative direction, it is determined that the line voltage crosses zero by determining that the average value of the latest predetermined number of sampled values of the line voltage is greater than the predetermined negative threshold.

15. The operating method according to claim 13, wherein after determining the direction of the voltage across the third phase bridge arm circuit as the positive direction, it is determined that the voltage across the third phase bridge arm circuit crosses zero by determining that the average value of the latest predetermined number of sampled values of the voltage across the third phase bridge arm circuit is less than the predetermined positive threshold; or after determining the direction of the voltage across the third phase bridge arm circuit as the negative direction, it is determined that the voltage across the third phase bridge arm circuit crosses zero by determining that the average value of the latest predetermined number of sampled values of the voltage across the third phase bridge arm circuit is greater than the predetermined negative threshold.

* * * * *